United States Patent
Puchner et al.

Patent Number: 6,144,076
Date of Patent: Nov. 7, 2000

[54] WELL FORMATION FOR CMOS DEVICES INTEGRATED CIRCUIT STRUCTURES

[75] Inventors: Helmut Puchner, Santa Clara; Shih-Fen Huang, Los Altos; Ruggero Castagnetti, San Jose, all of Calif.

[73] Assignee: LSI Logic Corporation, Milpitas, Calif.

[21] Appl. No.: 09/207,395

[22] Filed: Dec. 8, 1998

[51] Int. Cl.[7] .................................................. H01L 29/76
[52] U.S. Cl. ........................ 257/369; 257/371; 257/372
[58] Field of Search .................................... 257/369, 372, 257/375, 374, 394–399, 408, 506, 509, 510, 550, 269, 285, 404, 345, 371; 438/199, 223, 224, 227, 228

[56] References Cited

U.S. PATENT DOCUMENTS

| | | | |
|---|---|---|---|
| 5,045,898 | 9/1991 | Chen et al. ............................... | 257/506 |
| 5,304,833 | 4/1994 | Shigeki et al. ........................... | 257/372 |
| 5,668,775 | 9/1997 | Hidaka .................................... | 365/182 |
| 5,869,879 | 2/1999 | Fulford, Jr. et al. ..................... | 257/510 |

FOREIGN PATENT DOCUMENTS 0831518A  3/1998  European Pat. Off. .

*Primary Examiner*—Steven H. Loke
*Assistant Examiner*—Hung K. Vu
*Attorney, Agent, or Firm*—John P. Taylor

[57] ABSTRACT

A multiple well formation is provided in a CMOS region of a semiconductor substrate to provide enhanced latchup protection for one or more CMOS transistors formed in the wells. The structure comprises an N well extending from the substrate surface down into the substrate, a buried P well formed in the substrate beneath the N well, a second P well extending from the substrate surface down into the substrate, and an isolation region formed in the substrate between the N well and the second P well. The buried P well may extend beneath both the N well and the second P well in the substrate. In a preferred embodiment of the invention, the N well and the second P well are each implanted in the substrate at an energy level sufficient to provide a dopant concentration peak in the substrate below the depth of the isolation region to provide punch through protection and to provide a channel stop beneath the isolation region by proving a P-N junction between the N well and P well beneath the isolation region. The dopant concentration level peak of the dopants forming the buried P well in the substrate will be located below the dopant concentration level peak of the N well a minimum distance sufficient to inhibit reduction of the effective depth of the N well, and a maximum distance not exceeding the maximum distance which will still provide enhanced latchup protection to one or more transistors formed in the CMOS region.

21 Claims, 3 Drawing Sheets

WELL FORMATION FOR CMOS DEVICES INTEGRATED CIRCUIT STRUCTURES

BACKGROUND OF THE INVENTION

1. Field of the Invention

This invention relates to doped wells for CMOS devices of grated circuit structures. More particularly this invention relates to a silicon substrate having an N well region and a P well region formed therein and separated by an isolation region in the substrate, and having a buried P well region formed below at least the N well region to provide enhanced latchup protection for CMOS transistors formed in the wells.

2. Description of the Related Art

As transistor areas, interconnect structures, and isolation areas continue to reduce in scale, existing designs and methods for forming CMOS transistors in side by side P wells and N wells separated by isolation regions in the substrate have become inadequate. In particular when existing CMOS structures are reduced in scale, latchup problems arise or become more acute wherein parasitic bipolar devices cause short circuits and therefore high currents flow between the power (Vdd) bus and the ground (Vss) bus, which can, in turn, cause thermal destruction of the CMOS transistors.

To avoid increasing the risk of such problems as the scale is reduced it is desirable to decrease the resistance of substrate regions outside of the conventional well regions, and the respective N well and P well resistances are maintained as low as possible. At the same time, inhibition of the flow of channel currents from one well to the other below the isolation region must be maintained, and punch through protection below the isolation regions must also be maintained.

SUMMARY OF THE INVENTION

To provide enhanced latchup protection for one or more CMOS transistors formed in a CMOS region of a semiconductor substrate, a novel well formation is provided comprising an N well extending from the substrate surface down into the substrate, a buried P well formed in the substrate beneath the N well, a second P well extending from the substrate surface down into the substrate, and an isolation region formed in the substrate between the N well and the second P well. The buried P well may extend beneath both the N well and the second P well in the substrate.

In a preferred embodiment of the invention, the N well and the second P well are each implanted in the substrate at an energy level sufficient to provide a dopant concentration peak in the substrate below the depth of the isolation region to provide punch through protection beneath the isolation between the wells and to provide a channel stop beneath the isolation region by proving a P-N junction between the N well and P well dopants beneath the isolation region. The peak concentration level of the dopants forming the buried P well in the substrate will be located below the peak dopant concentration level of the N well a minimum distance sufficient to inhibit reduction of the effective depth of the N well, and a maximum distance which will still provide enhanced latchup protection to one or more transistors formed in the CMOS region.

DETAILED DESCRIPTION OF THE INVENTION

Figure 1A:
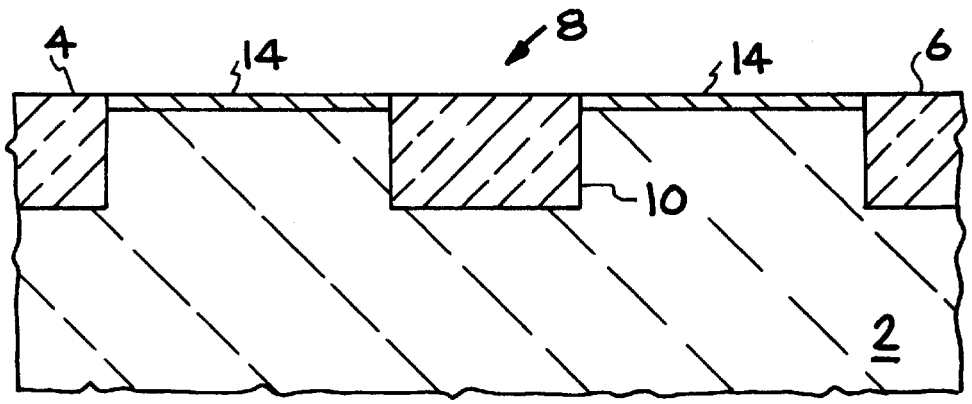
FIG. 1A is a fragmentary vertical cross-sectional view of a semiconductor substrate showing the isolation region as a central shallow trench isolation (STI) region extending down into the substrate from the substrate surface, with peripheral field oxide portions defining the outer boundaries of the CMOS structures to be constructed in the substrate.
Figure 1B:
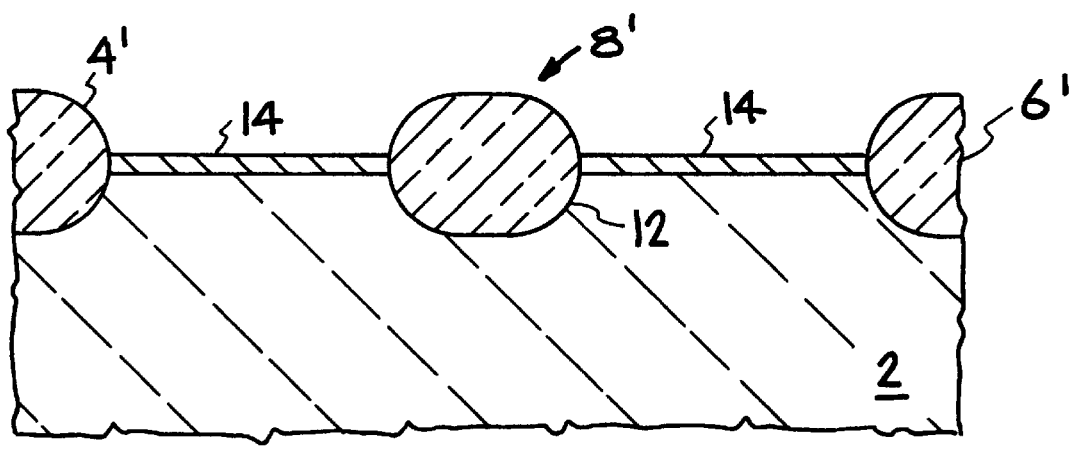
FIG. 1B is a fragmentary vertical cross-sectional view of a semiconductor substrate alternatively showing the isolation region as a central field oxide or local oxidation of silicon (LOCOS) isolation region extending down into the substrate from the substrate surface, with peripheral field oxide portions again defining the outer boundaries of CMOS structures to be constructed in the substrate.

Turning now to Figures IA and 1B, a semiconductor substrate 2, such as a silicon substrate, is shown having formed in the surface thereof, field oxide portions 4 and 6, defining therebetween a region in substrate 2 wherein CMOS transistors will be formed. Spaced midway between oxide trench portions 4 and 6 in FIG. 1A is an isolation region 8 which comprises a shallow trench isolation (STI) such as illustrated trench 10 extending down from the surface of substrate 2. At least the sidewall and bottom wall surface of trench 10 comprise an electrical insulation material such as silicon oxide ($SiO_2$). Alternatively, as shown in Figure 1B, isolation region 8' may comprise field oxide portion 12' similar to, and conveniently formed concurrently with, field oxide portions 4' and 6'. A thin sacrificial oxide layer 14 is shown formed over the exposed surface of substrate 2, in both FIGS. 1A and 1B, to protect the substrate surface during the subsequent implants to form the N well and the respective P wells.

The depth of isolation region 8 (trench 10), in accordance with the invention, will be at least equal to the depth of the source/drain regions of the MOS transistors to be respectively formed in the P and N wells extending down from the surface of the substrate so that the isolation region will provide the requisite electrical insulation or isolation between such source/drain regions adjacent the opposite sides of the isolation region. While the depth of isolation region 8 may exceed such a functional minimum depth spacing, such is not necessary and may negatively impact the minimum width of isolation region 8, as will be discussed below. Preferably, isolation region 8 may extend down from the surface of substrate 2 a distance ranging from about 200 nanometers (nm) to about 500 nm, more preferably from about 250 nm to about 350 nm, and typically about 300 nm.

The minimum width or horizontal dimension of isolation region 8 must be sufficient to permit formation of an N-P junction beneath isolation region 8 (when an N well and a P well are separated by isolation region 8) to provide a channel stop between the active regions in the respective wells. However, the minimum width of isolation region 8 is also influenced by the depth of isolation region 8. If field oxide is used to form isolation region 8, deeper field oxide formation will result in formation of a wider field oxide. If an isolation trench is used, a deeper trench will result in the need for an increase in the width dimension to keep the aspect ratio of the trench low enough to ensure satisfactory filling of the trench. While an isolation region width larger than such functional minimum widths could be utilized, such is unnecessary and therefore will be avoided to conserve space on the substrate.

Typically, for intrawell separation (the horizontal separation between adjacent P type source/drain regions or adjacent N type source/drain regions), an isolation region may have a width of as small as 0.2 $\mu$m; while for interwell spacing (the horizontal separation between an N type source/drain region and a P type source/drain region), an isolation region may have a width of as small as 0.6 $\mu$m. These small widths of isolation region 8 are possible, in accordance with the invention, due to the provision of the buried P well, as will be described below.

Figure 2:
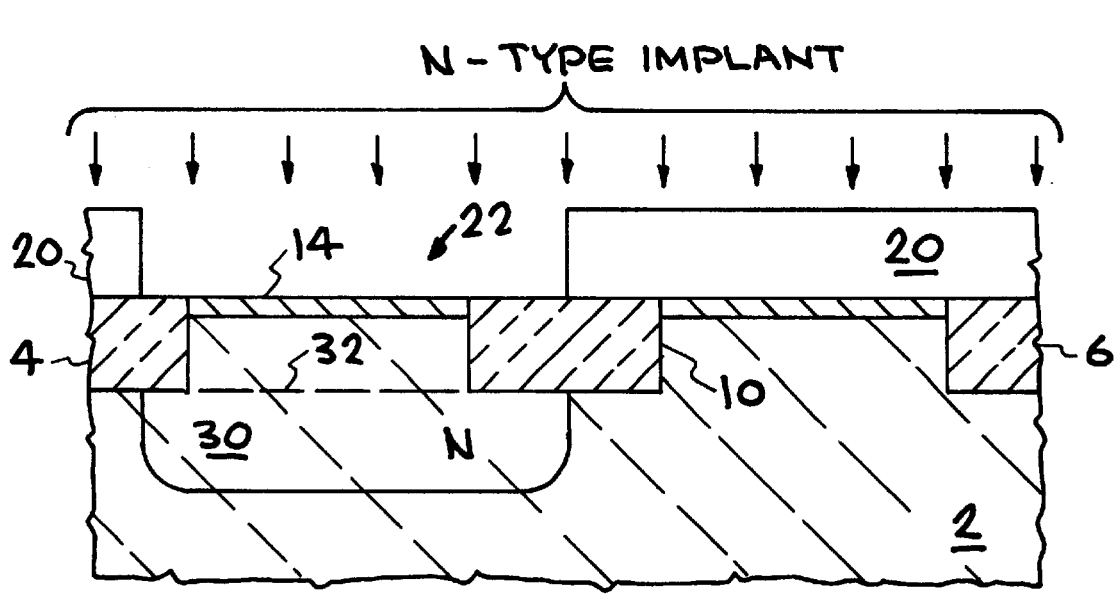
FIG. 2 is a fragmentary vertical cross-sectional view of the semiconductor substrate structure of FIG. 1A showing an N well being implanted in an unmasked portion of the semiconductor substrate.

FIG. 2 shows the structure of FIG. 1A with a mask 20, such as a resist mask, shown formed over the structure with an opening 22 therein exposing the region of substrate 2 where the N well is being formed. It will be noted in this regard, that N well mask opening 22 extends over only about half of isolation region 8 to thereby facilitate formation of the channel stop in substrate 2 beneath isolation region 8, as will be described below.

N well 30 is formed in substrate 2 by implanting substrate 2 through opening 22 in resist mask 20 with N type atoms such as phosphorus atoms. The N type atoms such as phosphorus are implanted at an energy level sufficient to provide a N type atom dopant concentration peak 32 at a depth ranging from approximately equal to (but not less than) the depth of isolation region 8 up to about 1¼ the depth of isolation region 8. The energy required to implant an N type atom such as phosphorus to this depth in substrate 2 will range from about 200 Kev to about 500 Kev, depending on the depth of isolation region 8. Typically, for an isolation region depth of about 300 nm, the implant energy used for a phosphorus implant will be about 280 Kev. As will be described in more detail below, this depth is selected to provide the same depth as the second P well which, in turn, will be constructed to this depth to provide adequate punch through protection.

The total dosage of the N type dopant such as phosphorus implanted into substrate 2 to form N well 30 will range from about $5 \times 10^{12}$ atoms/cm$^2$ to about $3 \times 10^{13}$ atoms/cm$^2$, and typically will be about $1.5 \times 10^{13}$ atoms/cm$^2$. As will be further explained below, when the N well is formed first, with a mask formed over the region of the substrate where the second P well will later be formed, and no other mask is used, N well 30 must be sufficiently doped with N type dopant to compensate for the P type dopant which the N well will be exposed to during the subsequent implantation step during the formation of the second P well.

Figure 3:
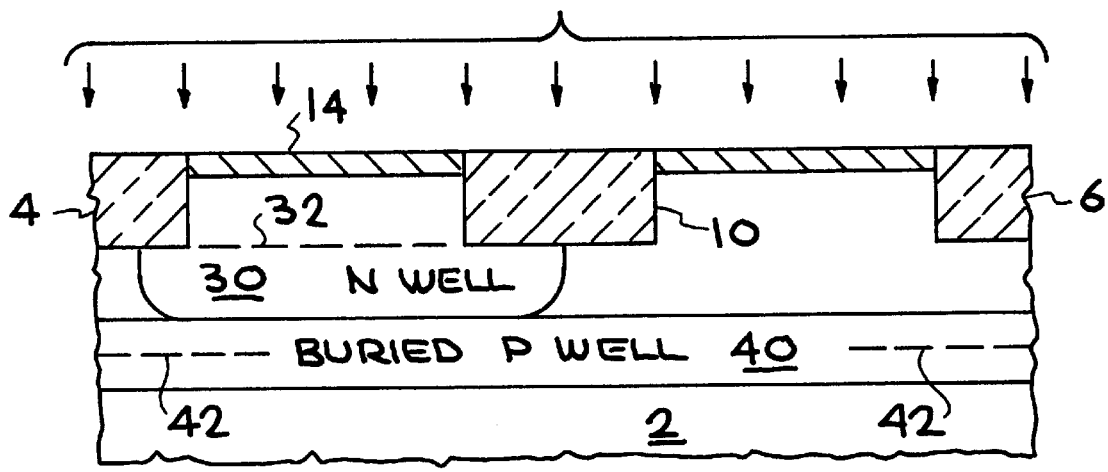
FIG. 3 is a fragmentary vertical cross-sectional view of the semiconductor substrate structure of FIG. 2, showing a buried P well being implanted beneath the N well in the substrate.

Turning now to FIG. 3, the formation of buried P type well or layer 40 will be described. Buried P well 40 is formed by implanting P type atoms such as boron into substrate 2 with sufficient energy to implant buried P well 40 in substrate 2 below N well 30 and the second P well which will be described below. The minimum distance or spacing of a dopant concentration peak 42 of buried P well 40 below the dopant concentration peak 32 of N well 30 will be that distance sufficient to not impede or interfere with the depth of the N well above the buried P well (i.e., not introduce an amount of P type dopant into the region of the substrate wherein the N well has been, or will be, formed sufficient to reduce the effective depth of the N well).

The maximum depth of dopant concentration peak 42 of buried P well 40 is that depth below which the resistance path from buried P well 40 up to the surface of substrate 8 would be too high to provide latchup protection for the CMOS structures. Since one of the principal functions of buried P well 40 is to provide latchup protection for the CMOS structures, it is, therefore, very important that this function depth limit not be exceeded. This maximum depth for buried P well 40 may, therefore, be empirically determined.

In one embodiment, however, the depth of buried P well 40, with respect to N well 30 will be determined by maintaining a spacing range from dopant concentration peak 32 in N well 30 to dopant concentration peak 42 in buried P well 40 of from about 0.7 micrometers ($\mu$m) up to about 1.1 $\mu$m, and typically about 0.9 $\mu$m. This can be achieved, for example, when forming buried P well 40 by implantation with boron, by use of an implant energy ranging from about 450 Kev to about 1 Mev, and typically about 700 Kev. The dopant dosage of P type dopant such as boron in buried P well 40 will normally range from about $5 \times 10^{14}$ atoms/cm$^2$ up to about $5 \times 10^{15}$ atoms/cm$^2$, and typically will comprise about $1 \times 10^{15}$ atoms/cm$^2$.

Figure 4:
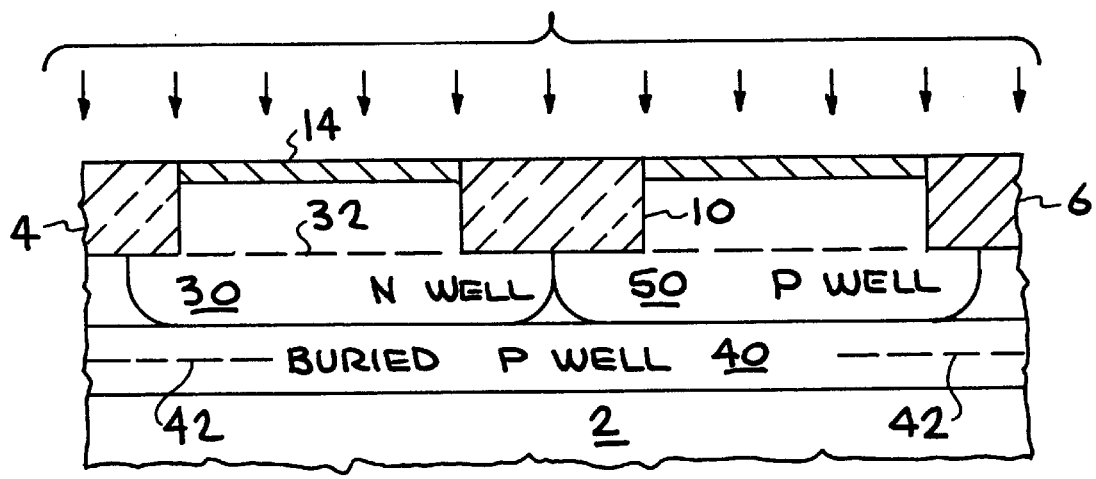
FIG. 4 is a fragmentary vertical cross-sectional view of the semiconductor substrate structure of FIG. 3, showing a second P well being implanted in the substrate above the buried P well and generally adjacent the N well.

FIG. 4 shows the formation of second P well 50 which is located above buried P well 40 and separated from N well 30 by isolation region 8. Second P well 50 is formed by implanting P type dopant such as boron into the surface of substrate 2 at an energy level ranging from about 80 to about 300 Kev, and typically about 100 Kev to provide a depth of a dopant concentration peak 52 in second P well 50 approximately equal to dopant concentration peak 32 of the N type dopant in N well 30. This will, in turn, result in the location of the dopant concentration peak 52 of P type dopant in second P well 50 below the depth of isolation region 8 to provide punch through protection. The implant energy will be further selected within this energy range to provide approximately the same spacing between dopant concentration peak 42 of buried P well 40 and dopant concentration peak 52 of second P well 50 as the previously described spacing between dopant concentration peak 42 of buried P well 40 and dopant concentration peak 32 of N well 30.

The dopant dosage in second P well 50, when the P type dopant is boron, will range from about $2.5 \times 10^{12}$ atoms/cm$^2$ up to about $1.5 \times 10^{13}$ atoms/cm$^2$, and typically will be about $6.8 \times 10^{12}$ atoms/cm$^2$. It will be noted that in the preferred embodiment described and illustrated, second P well 50 is formed without the use of a further mask over the previously formed N well 30. It will be further noted that the N type dopant concentration range given for N well 30 is much higher than the dopant concentration range of the P type dopant used to form second P well 50. The implantation of N well 30 with a much higher concentration of N type dopant permits the subsequent implantation of substrate 2 with a lower dopant concentration of P type dopant to form second P well 50 without the need to mask N well 30.

It should be also noted here, that while the described and illustrated order of forming N well 30, buried P well 40, and second P well 50 is the preferred order, it is within the scope of the invention to form the respective wells in other orders of construction. For example, buried P well 50 could be formed first, followed by formation of second P well 40, after which N well 30 would be formed last, with second P well 50 masked prior to formation of N well 30. Also, second P well 50 could be formed first, followed by formation of buried P well 40, with N well 30 again formed last after masking of second P well 50. However, in any event it is preferred that the two P well formation steps be sequential (either both formed before formation of the N well, or both formed subsequent to formation of the N well) in view of the mask used when forming N well 30 and also because this will facilitate setup in the P type implanter.

It should be further noted that by changing the respective dopant concentrations used for forming N well 30 and second P well 50, the single mask could be used for masking N well 30 rather than second P well 50. That is, N well 30 could be formed by a low concentration blanket doping step, with second P well 50 formed using a higher concentration of dopant either before or after formation of N well 30, with a mask then formed over N well 30 during the P type implantation to form second P well 50.

After formation of N well 30, buried P well 40, and second P well 50, any implantation damage to the substrate may be repaired by an anneal. Such an anneal is carried out, optionally, prior to gate electrode formation, and at least prior to the implantation of the source/drain regions of the CMOS transistors to be constructed in the wells. Such an anneal can be carried out in a furnace at a temperature ranging from about 850° C. to about 950° C. for a period of time ranging from about 20 to about 30 minutes. Alternatively, a conventional rapid thermal anneal (RTA) may be carried out, e.g., at 1150° C. for 30 seconds.

Figure 5:
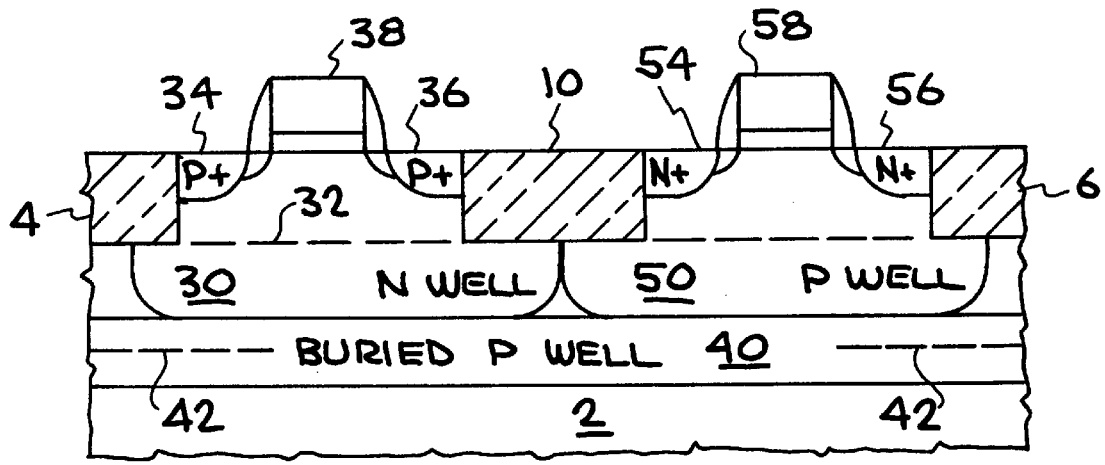
FIG. 5 is a fragmentary vertical cross-sectional view of the semiconductor substrate structure of FIG. 4, showing CMOS transistors formed respectively in the N well and the second P well in the substrate.

After formation of N well 30, buried P well 40, and second P well 50, conventional CMOS transistors may be constructed respectively in N well 30 and second P well 50, as illustrated in FIG. 5, comprising P+source/drain regions 34 and 36 and gate electrode 38 in N well 30, and N+ source/drain regions 54 and 56 and gate electrode 58 in second P well 50. The resulting CMOS structure has improved latchup protection due to the presence of buried P well 40 below N well 30 and second P well 50; and punch through protection maintained for P+source/drain region 36 through N well 30 and beneath isolation region 10, and for N+source/drain region 54 through second P well 50 and beneath isolation region 10; and with a channel stop provided by the junction between N well 30 and P well 50 below the isolation region formed by trench 10.

To further illustrate the invention, field oxide was grown on a silicon substrate surrounding a mask area delineating a rectangular region where CMOS transistors would be formed. After removal of the mask, a trench, having a width of about 800 nanometers, was formed across the middle of the region previously masked region to a depth of about 300 nm. The trench was then filled with silicon oxide to form an isolation trench. A resist mask was then formed over a portion of the region where a P well would be subsequently formed. The resist mask extended over about one half of the width of the isolation trench. An N well was then implanted into the unmasked portion of the silicon substrate by implanting the area with phosphorus at an energy level of about 280 Kev and at a dopant dosage of about $1.5 \times 10^{13}$ phosphorus atoms per $cm^2$. This resulted in an N well formed with a dopant concentration peak lower than the depth of the insulation trench. The mask was then removed and a buried P well was formed in the substrate below the N well by implanting boron atoms at an energy of about 700 Kev and at a dopant dosage of about $1 \times 10^{15}$ boron atoms per $cm^2$. A second P well was then formed in the substrate above the buried P well and separated from the N well by the isolation trench by implanting the substrate with boron at an energy level of 100 Kev and at a dopant dosage of about $6.8 \times 10^{12}$ boron atoms per $cm^2$.

Gate electrodes, lightly doped drain (LDD) regions, oxide spacers over the LDD regions, and source/drain regions were then formed in and on the respective wells, as shown in FIG. 5, as well as a tap to the N well (not shown) and a tap to the second P well (also not shown). Trigger current measurements were then made between the P well tap and the PMOS source/drain regions formed in the N well; and between the N well tap and the NMOS source/drain regions formed in the P well. In each instance, triggering, indicative of latchup, did not occur until the trigger current reached about 200 microamperes ($\mu$A) per $\mu$m.

Figure 6:
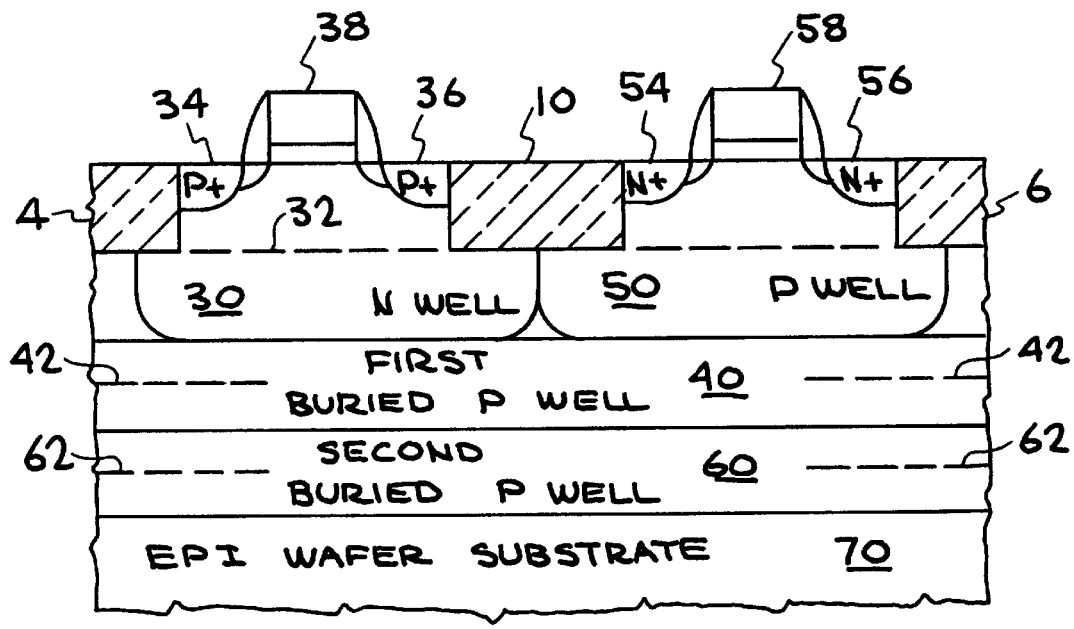
FIG. 6 is a fragmentary vertical cross-sectional view of another embodiment of the invention showing the semiconductor substrate structure of FIG. 4, with a second buried P well implanted in the substrate below the first buried P well and above the substrate portion of an EPI wafer.
Figure 7:
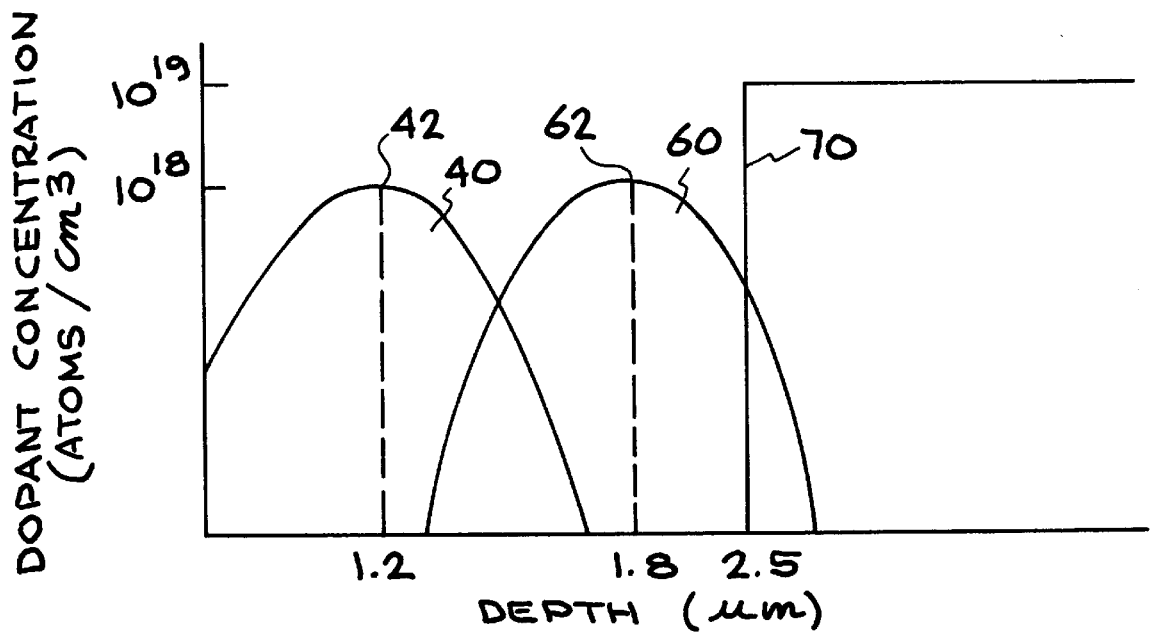
FIG. 7 is a graph plotting dopant concentration against depth and showing the dopant concentration peaks of the N well, the first buried P well and the second buried P well with respect to the depth of the EPI substrate in the structure of FIG. 6.

FIGS. 6 and 7 illustrate another embodiment of the invention, wherein latchup protection may be further enhanced when a modified form of the invention is utilized with an EPI wafer wherein a lightly doped epitaxial (EPI) layer is grown on more highly doped substrate of the EPI wafer. By use of the term "lightly doped" with respect to the epitaxial layer on the EPI wafer is meant a dopant concentration not exceeding about 1016 atoms/$cm^3$, whereas the term "more highly doped" as used herein in connection with the dopant concentration in the EPI wafer substrate is meant a dopant concentration of at least about $10^{18}$ atoms/cm.

In FIG. 6, wherein like elements are labelled with like numerals, a single additional buried P well layer 60 is shown formed by implantation below first buried P well layer 40 to provide a low resistance link (through the EPI layer) between buried P well 40 and a highly doped substrate 70 ($1 \times 10^{19}$ atoms/$cm^3$) of the EPI wafer to provide further latchup protection for the CMOS structure by providing a low resistance path from N well 30 through first buried P well 40 and second buried P well 60 to the low resistance substrate 70 of the EPI wafer. By use of the term "low resistance path" in connection with the resistance path formed through the buried P well layers from the N well layer to the more highly doped substrate of the EPI wafer in this embodiment is meant a resistance path lower than the resistance path through the lightly doped epitaxial layer of the EPI wafer.

Whether only a single additional P well layer 60 would be needed in this embodiment, or further layers, will depend upon the distance between higher doped substrate 70 of the EPI wafer and first buried P well 40 (i.e., the total thickness of the EPI layer on substrate 70 of the EPI wafer). In the illustrated structure, wherein the total thickness of the EPI layer on substrate 70 is 2.5 $\mu$m (surface to substrate 70), and the distance from the surface to dopant concentration peak 42 of buried P well 40 is about 1.2 $\mu$m (300 $\mu$m depth of isolation region 10 plus 0.9 $\mu$m distance from peak 32 of N well 30 to peak 42 of buried P well 40), provision of a single additional layer 60 implanted to a depth of about 1.8 $\mu$m will be sufficient. This second buried P well layer 60, for example, may be formed by implanting boron at an energy level of from about 700 Kev to about 2 Mev, preferably about 1.5 Mev, with a dopant concentration similar to that used for the formation of first buried P well 40, i.e., the dopant dosage of boron implanted in buried P well 60 would normally range from about $5 \times 10^{14}$ atoms/cm$^2$ up to about $5 \times 10^{15}$ atoms/cm$^2$, and typically will comprise about $1 \times 10^{15}$ atoms/cm$^2$. The resulting dopant concentration peak 62 in second buried layer 60 would then be about midway between the depth of dopant concentration peak 42 in first buried layer 40 and the depth of higher doped substrate 70. This is also illustrated in the graph of FIG. 7.

In other instances the number of additional buried P well layers which would be needed in this embodiment to form the desired low resistance link between first buried P well layer 40 and doped substrate 70 of the EPI wafer may be determined empirically by measuring and comparing the improvement in latchup protection afforded by a single additional buried layer in an EPI wafer compared to the use of a standard wafer. The amount of improvement of the litchup protection will indicated whether or not one or more further buried P well layers are needed. For example, if one additional buried P well layer is formed by implantation between first buried P well layer 40 and EPI wafer substrate 70, as in FIGS. 6 and 7 (i.e., layer 60), and then a further buried P well layer is implanted deeper without significant improvement in the latchup protection, one will know that implantation of further layers is not needed. Furthermore, once the number of needed layers is determined to formed the desired low resistance path between EPI substrate 70 and N well 30, one may also empirically determine the optimum implant energy needed to place the additional P well (or wells) in the optimum position between first buried P well 40 and EPI substrate 70.

Thus the improved CMOS structure of the invention, having at least one buried P well formed beneath at least the N well of the CMOS structure, provides improved latchup protection while maintaining punch through protection, and a channel stop between the P well and the N well beneath the isolation region, resulting in the ability to decrease the dimensions, particularly the width, of the isolation region between wells. Furthermore, by controlling the dopant concentrations used in the formation of the respective wells, the buried P well, and the N well and second P well separated by the isolation region, may all be formed in the substrate using a single mask.

Having thus described the invention what is claimed is:

1. An integrated circuit structure formed on a semiconductor substrate with enhanced protection against latchup in a CMOS region of said integrated circuit structure by provision of a buried P well in said CMOS region spaced within a particular vertical distance range below an N well and a first P well in said CMOS region, said CMOS region comprising;
   a) an N well in said substrate extending down from the surface of said substrate;
   b) a first P well extending down from said surface of said substrate adjacent said N well;
   c) a buried P well formed in said substrate [at least] beneath said N well and said first P well, wherein the depth of the peak dopant concentration in said buried P well is;
      (i) spaced from the peak dopant concentration of said N well a minimum distance of at least about 0.7 $\mu$m which will not introduce an amount of P type dopant into the region of the substrate where the N well has been or will be formed sufficient to reduce the effective depth of said N well; and
      (ii) spaced a maximum distance from said peak dopant concentration of said N well not exceeding about 1.1 $\mu$m, wherein the resistance path from said buried P well to said substrate surface will not be too high to provide enhanced latchup protection to one or more transistors formed in said CMOS region; and
   d) an isolation region extending down from said surface of said substrate and separating at least a portion of said N well from said first P well, wherein:
      i) the minimum depth of said isolation region substrate is at least equal to the depth of one or more source/drain regions formed in said N well and/or said first P well of said CMOS region to provide punch through protection for said source/drain regions; and
      ii) the minimum width of said isolation region between said N well and said first P well, at said surface of said substrate, is further that width:
         1) sufficient to permit formation of said isolation region in said substrate to said minimum depth; and
         2) sufficient to permit formation of a P-N junction beneath said isolation region capable of functioning as a channel stop between said source/drain regions formed in said respective wells.

2. The integrated circuit structure of claim 1 wherein the depth of said isolation region in said substrate will range from about 200 nm to about 500 nm.

3. The integrated circuit structure of claim 1 wherein the depth of said isolation region in said substrate will range from about 250 nm to about 350 nm.

4. The integrated circuit structure of claim 1 wherein the depth of said peak dopant concentration in said N well in said substrate will range from at least equal to the depth of said isolation region to about 1¼ of the depth of said isolation region.

5. The integrated circuit structure of claim 1 wherein the depth of said peak dopant concentration in said first P well in said substrate will range from at least equal to the depth of said isolation region to about 1¼ of the depth of said isolation region.

6. A CMOS region formed in an integrated circuit structure on a semiconductor substrate with enhanced protection against latchup by provision of a buried P well in said CMOS region spaced within a particular vertical distance beneath an N well and a first P well in said CMOS region, said CMOS region comprising;
   a) an N well in said substrate extending down from the surface of said substrate;
   b) a first P well extending down from said surface of said substrate adjacent said N well;
   c) a buried P well formed in said substrate beneath said N well and said first P well, wherein the depth of the peak dopant concentration in said buried P well is:
      (i) spaced from the peak dopant concentration of said N well a minimum distance of at least about 0.7 $\mu$m, to thereby not introduce an amount of P type dopant into the region of the substrate where the N well has been or will be formed sufficient to reduce the effective depth of said N well; and
      (ii) spaced a maximum distance not exceeding about 1.1 $\mu$m from said peak dopant concentration of said N well. whereby the resistance path from said buried P well up to the surface of said substrate will not be too high to provide enhanced latchup protection to one or more transistors formed in said CMOS region; and d) an isolation region extending down from said surface of said substrate and separating at least a portion of said N well from said first P well, wherein:
   i) the depth of said isolation region substrate ranges from about 200 nm to about 500 nm to provide punch through protection for source/drain regions of one or more transistors formed in said CMOS region; and
   ii) the minimum width of said isolation region between said N well and said first P well, at said surface of said substrate, is at least about 0.6 $\mu$m to thereby:
      1) permit formation of said isolation region in said substrate to said minimum depth; and
      2) permit formation of a P-N junction beneath said isolation region capable of functioning as a channel stop between said source/drain regions formed respectively in said N well and said first P well.

7. The CMOS region formed in an integrated circuit structure of claim 6 wherein said N well is implanted in said substrate at an energy level equivalent to an energy level for a phosphorus dopant ranging from about 200 Kev to about 500 Kev and a dosage equivalent to a phosphorus dosage of from about $5\times10^{12}$ phosphorus atoms/cm$^2$ to about $3\times10^{13}$ phosphorus atoms/cm.

8. The CMOS region formed in an integrated circuit structure of claim 6 wherein said buried P well is implanted in said substrate at an energy level equivalent to an energy level for a boron dopant ranging from about 450 Kev to about 1 Mev and a dosage equivalent to a boron dosage of from about $5\times10^{14}$ boron atoms/cm$^2$ to about $5\times10^{15}$ boron atoms/cm$^2$.

9. The CMOS region formed in an integrated circuit structure of claim 6 wherein said first P well is implanted in said substrate at an energy level equivalent to an energy level for a boron dopant ranging from about 80 Kev to about 300 Kev and a dosage equivalent to a boron dosage of from about $2.5\times10^{12}$ boron atoms/cm$^2$ to about $1.5\times10^{13}$ boron atoms/cm$^2$.

10. An integrated circuit structure formed on a semiconductor wafer having a lightly doped epitaxial layer formed on the surface of said wafer and a more heavily doped substrate, with enhanced protection against latchup in a CMOS device formed in a CMOS region in said epitaxial layer, said integrated circuit structure comprising;
   a) an N well in said substrate extending down from the surface of said substrate;
   b) a P well extending down from said surface of said substrate adjacent said N well;
   c) a first buried P well formed in said substrate beneath at least a portion of said N well and at least a portion of said P well;
   d) an isolation region extending down from said surface of said substrate and separating at least a portion of said N well from said P well; and
   e) at least one additional buried P well formed beneath said first buried P well and between said first buried P well and said more heavily doped substrate to form a vertical low resistance path between said N well and said substrate through said buried P wells to thereby reduce latchup in said CMOS device.

11. The integrated circuit structure of claim 10 wherein the depth of said isolation region in said substrate will range from about 200 nm to about 500 nm.

12. The integrated circuit structure of claim 10 wherein the depth of said isolation region in said substrate will range from about 250 nm to about 350 nm.

13. The integrated circuit structure of claim 10 wherein the depth of said peak dopant concentration in said N well in said substrate will range from at least equal to the depth of said isolation region to about 1¼ of the depth of said isolation region.

14. The integrated circuit structure of claim 10 wherein the depth of said peak dopant concentration in said P well in said substrate adjacent said N well will range from at least equal to the depth of said isolation region to about 1¼ of the depth of said isolation region.

15. The integrated circuit structure of claim 10 wherein the depth of the peak dopant concentration in said first buried P well is spaced from the peak dopant concentration of said N well a minimum distance of at least about 0.7 $\mu$m to inhibit reduction of the effective depth of said N well.

16. The integrated circuit structure of claim 10 wherein the depth of said N well is selected to be the same depth as the P well adjacent said N well and the depth of the peak dopaiit concentration in said first buried P well is spaced from the peak dopant concentration of said N well a distance not exceeding about 1.1 $\mu$m whereby the resistance path from said first buried P well to said substrate surface will not be too high to provide enhanced latchup protection to one or more transistors formed in said CMOS region.

17. The integrated circuit structure of claim 10 wherein the depth of said N well is selected to be the same depth as the P well adjacent said N well, and the depth of the peak dopant concentration in said first buried P well is spaced from the peak dopant concentration of said N well a distance ranging from a minimum distance of at least about 0.7 $\mu$m to inhibit reduction of the effective depth of said N well to a maximum distance not exceeding about 1.1 $\mu$m whereby the resistance path from said first buried P well to said substrate surface will not be too high to provide enhanced latchup protection to one or more transistors formed in said CMOS region.

18. The CMOS region formed in an integrated circuit structure of claim 10 wherein said N well is implanted in said substrate at an energy level equivalent to an energy level for a phosphorus dopant ranging from about 200 Kev to about 500 Kev and a dosage equivalent to a phosphorus dosage of from about $5\times10^{12}$ phosphorus atoms/cm$^2$ to about $3\times10^{13}$ phosphorus atoms/cm$^2$.

19. The CMOS region formed in an integrated circuit structure of claim 10 wherein said first buried P well is implanted in said substrate at an energy level equivalent to an energy level for a boron dopant ranging from about 450 Kev to about 1 Mev and a dosage equivalent to a boron dosage of from about $5\times10^{14}$ boron atoms/cm$^2$ to about $5\times10^{15}$ boron atoms/cm$^2$.

20. The CMOS region formed in an integrated circuit structure of claim 10 wherein said P well adjacent said N well is implanted in said substrate at an energy level equivalent to an energy level for a boron dopant ranging from about 80 Kev to about 300 Kev and a dosage equivalent to a boron dosage of from about $2.5\times10^{12}$ boron atoms/cm$^2$ to about $1.5\times10^{13}$ boron atoms/cm$^2$.

21. An integrated circuit structure formed on a semiconductor substrate with enhanced protection against latchup in a CMOS region of said integrated circuit structure by provision of a builed P well in said CMOS region spaced within a particular vertical distance range below an N well and a first P well in said CMOS region, said CMOS region comprising;
   a) an N well in said substrate extending down from the surface of said substrate;
   b) a first P well extending down from said surface of said substrate adjacent said N well to a depth approximating that of said N well;

c) a buried P well formed in said substrate beneath said N well and said first P well, wherein the depth of the peak dopant concentration in said buried P well is:
   (i) spaced from the peak dopant concentration of said N well a minimum distance of at least about 0.7 μm, to thereby not introduce an amount of P type dopant into the region of the substrate where the N well has been or will be formed sufficient to reduce the effective depth of said N well; and
   (ii) spaced a maximum distance of not greater than 1.1 μm from said peak dopant concentration of said N well, whereby the resistance path from said buried P well to said substrate surface will not be too high to provide enhanced latchup protection to one or more transistors formed in said CMOS region; and
d) an isolation region extending down from said surface of said substrate and separating at least a portion of said N well from said first P well, wherein:

i) the minimum depth of said isolation region substrate is at least equal to the depth of one or more source/drain regions formed in said N well and/or said first P well of said CMOS region to thereby provide punch through protection for said source/drain regions; and
ii) the minimum width of said isolation region between said N well and said first P well, at said surface of said substrate, is further that width:
   1) sufficient to permit formation of said isolation region in said substrate to said minimum depth; and
   2) sufficient to permit formation of a P-N junction beneath said isolation region capable of functioning as a channel stop between said source/drain regions formed in said respective wells.

* * * * *